United States Patent [19]
Lee et al.

[11] Patent Number: 5,422,312
[45] Date of Patent: Jun. 6, 1995

[54] METHOD FOR FORMING METAL VIA

[75] Inventors: David Lee, Hsinchu; Water Lur, Taipei, both of Taiwan, Prov. of China

[73] Assignee: United Microelectronics Corp., Hsinchu, Taiwan, Prov. of China

[21] Appl. No.: 254,122

[22] Filed: Jun. 6, 1994

[51] Int. Cl.6 ........................ H01L 21/28; H01L 21/31
[52] U.S. Cl. ............................ 437/195; 437/228; 437/978; 437/981; 148/DIG. 105
[58] Field of Search ............ 437/195, 228, 190, 192, 437/978, 981; 756/644; 748/DIG. 105

[56] References Cited

U.S. PATENT DOCUMENTS 4,737,757 4/1988 Senda et al. ................... 338/308
4,745,089 5/1988 Orban ............................ 437/190
5,219,793 6/1993 Cooper et al. ................. 437/195

FOREIGN PATENT DOCUMENTS 4-199514 7/1992 Japan.
5-13593 1/1993 Japan.

*Primary Examiner*—T. N. Quach
*Attorney, Agent, or Firm*—Ladas & Parry

[57] ABSTRACT

A method of forming a metal via on a semiconductor substrate having a metal layer and a dielectric layer on the metal layer, which uses an intermediate mask layer as a mask in forming the metal via instead of using a photoresist as a mask. Therefore, the spin-on glass (SOG) layer in the dielectric layer is not exposed to plasma or solvent, thereby preventing the formation of polymers which cause poor step coverage and sometimes even contact failure in the metal via.

11 Claims, 3 Drawing Sheets

METHOD FOR FORMING METAL VIA

BACKGROUND OF THE INVENTION

1. Field of the Invention

The present invention relates to a method of forming a metal via in a semiconductor integrated circuit (IC), and, more particularly, to a method of forming a metal via in a semiconductor integrated circuit by utilizing an intermediate mask layer to etch the metal via for improving the step coverage of a metal contact layer.

2. Technical Background

A conventional method of forming a metal via in a semiconductor integrated circuit is shown in FIGS. 1a to 1e. The semiconductor integrated circuit includes a semiconductor substrate (not shown), a metal layer 120, and a dielectric layer 140. The dielectric layer 140 has a first dielectric such as silicon oxide layer 1420 which is formed by plasma enhanced chemical vapor deposition (PECVD), a second dielectric such as spin-on glass (SOG) 1440, and a third dielectric such as second silicon oxide layer 1460 which is also formed by PECVD. The conventional method of forming a metal via includes the steps as follows:

(1) Coating a photoresist layer 160 on the dielectric layer 140, and forming an opening 1620 at a predetermined position by conventional lithography techniques, as shown in FIG. 1a.

(2) Forming a metal via 10 by dry etching using the photoresist 160 as a mask as shown in FIG. 1b. Then, as illustrated in FIG. 1c, the photoresist 160 is removed by plasma or solvent. Alternatively, and as shown in FIG. 1d, the metal via 10 may be formed according to conventional wet by dry etching processes. In wet by dry etching processes a wet etch is used first to isotropically etch the top portion of the via, and then a dry etch is used to anisotropically etch the remainder of the via.

In the production of very large scale integrated circuits (VLSIs), flatness between multiple metal layers is usually maintained by using SOG. Since SOG can not be cured at sufficiently high temperature in order to achieve the same quality as PECVD $SiO_2$ while metal (Aluminum) is present, unwanted damage occurs on the sidewalls of the metal via 10 during removal of the photoresist by plasma or solvent. As shown in FIG. 1e, damages in the via associated with SOG structure such as poor step coverage, or poor surface property for a later formed metal layer 180 results in a contact failure in the metal via 10. The effect of via damage is even worse when siloxane type of SOG is used.

Another problem of the conventional method is deformation of the metal via 10. Since the dielectric layer 140 is transparent to ultraviolet light and the metal layer 120 is highly reflective, the opening 1620 is enlarged during exposure due to reflection of ultraviolet light in the dielectric layer 140.

There are other problems in the conventional method. Since the dielectric layer is to be etched to form the opening 1620, the thickness of the photoresist 160 is usually 20 to 30 kÅ. If the thickness of the photoresist 160 can be reduced, the photoresist is easier to develop. Furthermore, a reduction in thickness of the photoresist 160 reduces the problem of depth of focus in alignment and results in cost savings because less photoresist 160 is used.

SUMMARY OF THE INVENTION

The main object of the present invention is to eliminate via damage and contact failure in the metal via having a SOG structure.

Another object of the present invention is to solve the problem of deformation of the metal via due to reflection.

Another object of the present invention is to provide a method of forming a metal via by using a thinner photoresist, thereby making the development of photoresist easier, solving the problem of depth of focus in alignment, and reducing the cost of photoresist.

The above objects are fulfilled by providing a method of forming a metal via at a predetermined position on a semiconductor substrate having a metal layer and a dielectric layer on the metal layer. The method comprises the steps of: (a) forming an intermediate mask layer on the dielectric layer; (b) removing the portion of the intermediate mask layer at the predetermined position; and (c) dry etching the dielectric layer using the intermediate mask layer as a mask to form the metal via.

BRIEF DESCRIPTION OF THE DRAWING

The present invention will become more fully understood from the detailed description given hereinafter with reference to the accompanying drawings which are given by way of illustration only, and thus are not limitation of the present invention and wherein.

DETAILED DESCRIPTION OF THE PREFERRED EMBODIMENT

Figure 1A:
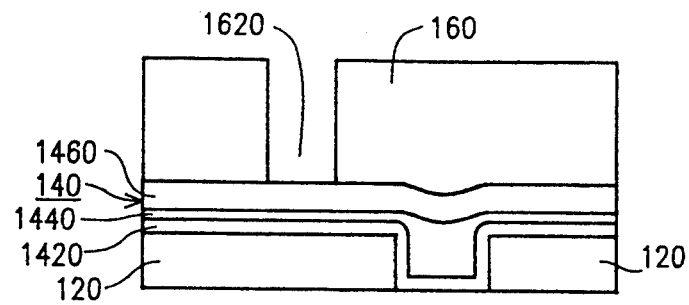
FIGS. 1a, 1b, 1c, 1d, and 1e show cross-sectional views of the conventional method.
Figure 1B:
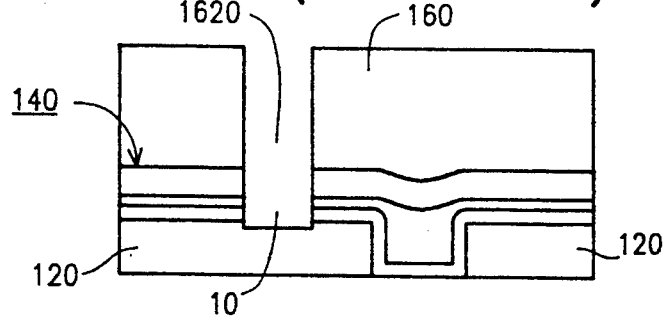
Figure 1C:
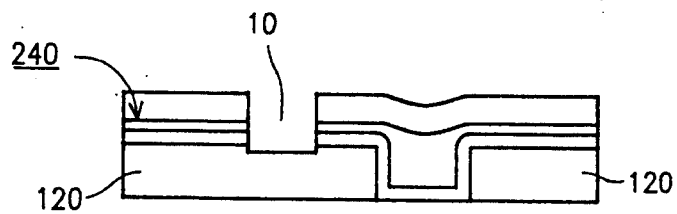
Figure 1D:
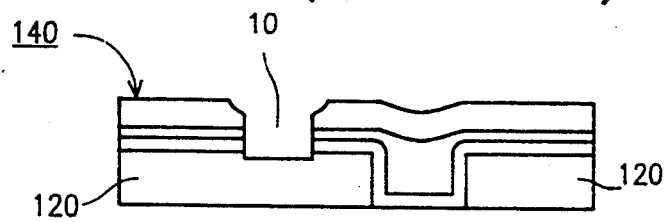
Figure 1E:
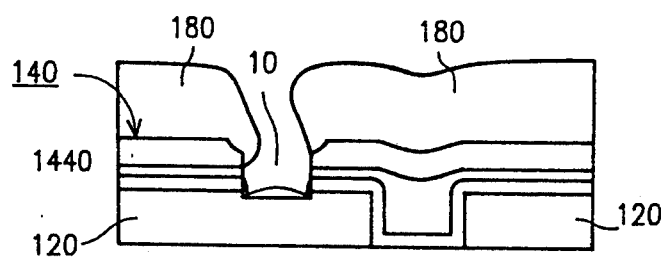
Figure 2A:
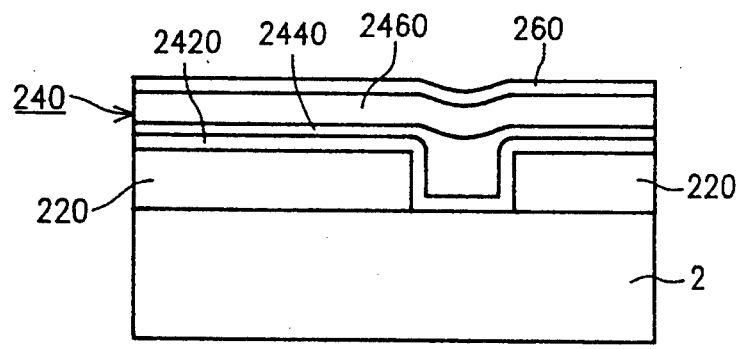
FIGS. 2a, 2b, 2c, 2d, 2e, and 2f show cross-sectional views of the method according to the present invention.

A method of forming a metal via in a semiconductor integrated circuit according to the present invention is illustrated in FIGS. 2a to 2f. The semiconductor integrated circuit comprises a semiconductor substrate 2, a metal layer 220, and a dielectric layer 240. The dielectric layer 240 has a first silicon oxide layer 2420 which is formed by plasma enhanced chemical vapor deposition (PECVD), a spin-on glass (SOG) layer 2440, and a second silicon oxide layer 2460 which is formed by PECVD The Spin-on Glass (SOG) process is detailed in "Silicon Processing for the VLSI Era" Volume 2, chapter 4, pp. 229–236 by S. Wold and R. N. Tauber and is herein incorporated by reference. The method of this invention of forming a metal via includes the following steps:

Step 1:

An intermediate mask layer 260 is formed on the dielectric layer 240 as shown in FIG. 2a by conventional deposition techniques such as reactive sputtering of Ti in an $N_2$ environment. The intermediate mask layer 260 may be Titanium Nitride ($TiN_x$), or Tantalum Nitride ($TaN_x$). The thickness of the intermediate mask layer 260 is preferably from 700 to 1000 Å.

Figure 2B:
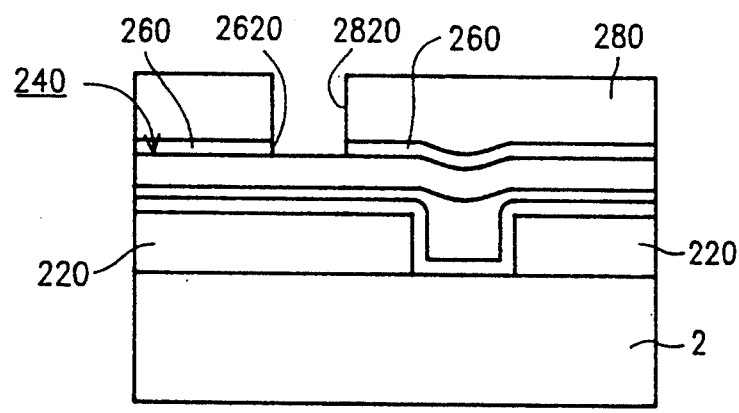
Figure 2C:
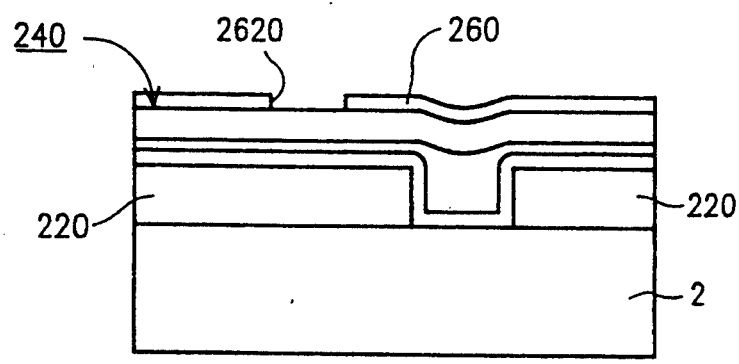

Step 2:

An opening 2620 is formed at a predetermined position in the intermediate mask layer 260 by conventional photolithography techniques. This can be done by first coating a photoresist layer 280 on the intermediate mask layer 260 and forming a photoresist opening 2820 in the photoresist layer 280 at the predetermined position by conventional lithography techniques as shown in FIG. 2b, and secondly etching the intermediate mask layer 260 to form the opening 2620 and then removing the photoresist layer 280. The etching of the intermediate mask layer 260 can be performed with a conventional $BCl_3 + Cl_2$ dry etching condition. Since only the intermediate mask layer 260 is to be etched, the thickness of the photoresist layer 280 can be reduced to less than 10 kÅ. The photoresist layer 280 can be stripped using conventional techniques.

Figure 2D:
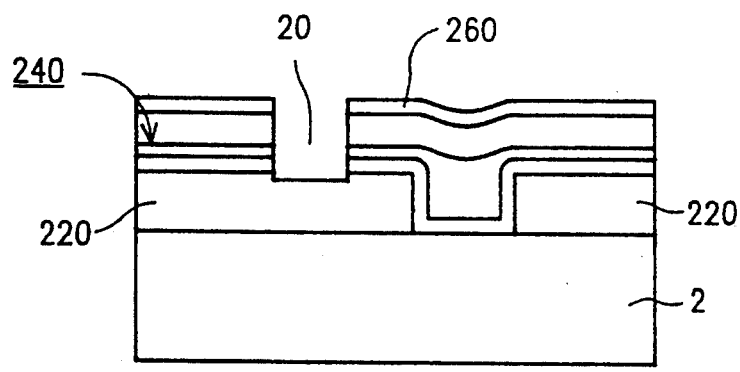
Figure 2E:
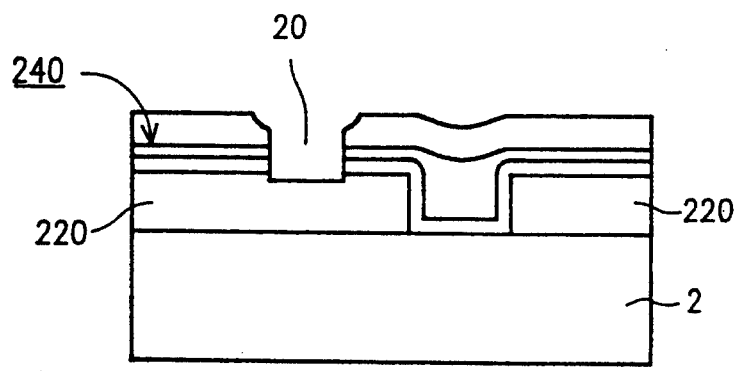
Figure 2F:
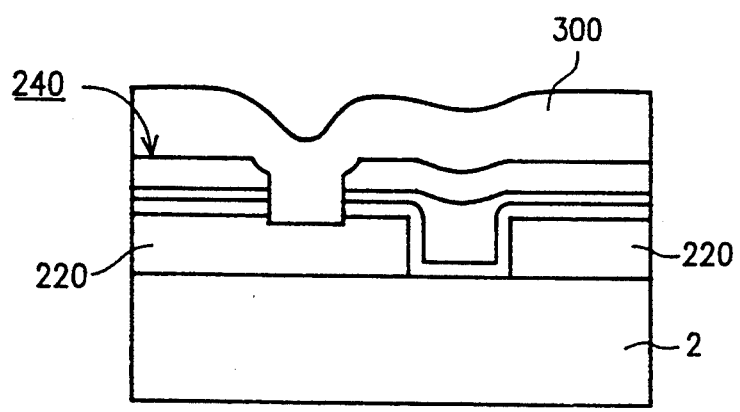

Step 3:

A metal via 20 is formed by dry etching techniques using the intermediate mask layer 260 as a mask as shown in FIG. 2d in a $CHF_3$ and $O_2$ or the like plasma. Thereafter, the intermediate mask layer 260 may be removed or retained. Alternatively, and as shown in FIG. 2e, the metal via 20 may be formed according to conventional wet by dry etching technique as discussed above. Alternatively, the photoresist layer 280 can be stripped after wet etching, followed by a dry etching using the intermediate mask layer 260 as mask. In this preferred embodiment in FIG. 2e, the intermediate mask layer 260 is consumed in the via etching process, or additionally stripped with a $CF_4$ plasma, after which another metal layer 300 may be deposited by, for example, sputtering as shown in FIG. 2f.

According to the foregoing method of forming the metal via 20 in a semiconductor integrated circuit, the intermediate mask layer 260 is formed on the surface of dielectric layer 240, after which the metal via 20 is formed by dry etching using the intermediate mask layer 260 as the mask, instead of using a photoresist as the mask as with prior art processes. Therefore, the SOG 2440 exposed on the sidewalls of the metal via 20 will not suffer damages caused by photoresist related process such as solvent or plasma process when removing the photoresist 280. As a result, via integrity is achieved during subsequent deposition of a metal layer. Furthermore, in the embodiment in FIG. 2e where wet by dry via is employed, the wet etched portion is also limited within the second silicon oxide layer 2460. Therefore, the wet etch process also avoids the SOG 2440 from contacting wet solutions.

Since the reflection ratio of the intermediate mask layer 260 is much less than that of the metal layer 220, the photoresist opening 2820 will not be enlarged in exposure when it is being formed. Therefore, the size and shape of the photoresist opening 2820 may be precisely controlled. In the preferred method disclosed herein, the thickness of the photoresist layer 280 may be reduced, thereby making the development of the photoresist 280 easier, reducing the problem of depth of focus in alignment and decreasing the cost of the photoresist 280 due to using less photoresist.

while the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming a metal via of a semiconductor integrated circuit having a metal layer and at least one dielectric layer on said metal layer, the method comprising the steps of:
   (a) forming an intermediate mask layer on said at least one dielectric layer;
   (b) forming a photoresist layer on said intermediate mask layer, said photoresist layer having an opening at the predetermined position;
   (c) removing a portion of said intermediate mask layer through said opening;
   (d) wet etching a portion of said at least one dielectric layer using said intermediate mask layer as a mask; and
   (e) dry etching remaining portion of said at least one dielectric layer using said intermediate mask layer as a mask, said dry etching consuming said intermediate mask layer.

2. The method of claim 1, further comprising a step of:
   (f) forming another metal layer on said at least one dielectric layer after said intermediate mask layer is consumed.

3. The method of claim 2, wherein said intermediate mask layer comprises titanium nitride.

4. The method of claim 2, wherein said intermediate mask layer comprises tantalum nitride.

5. The method of claim 1, wherein said intermediate mask layer comprises titanium nitride.

6. The method of claim 1, wherein said intermediate mask layer comprises tantalum nitride.

7. A method of forming metal via of a semiconductor integrated circuit having a patterned metal layer, the method comprising the steps of:
   (a) forming a first dielectric layer on said metal layer;
   (b) forming a second dielectric layer on said first dielectric layer, said second dielectric layer including SOG;
   (c) forming a third dielectric layer on said second dielectric layer;
   (d) forming an intermediate mask layer on said third dielectric layer;
   (e) forming a photoresist layer on said intermediate mask layer, said photoresist layer having an opening at the predetermined position;
   (f) removing a portion of said intermediate mask layer through said opening;
   (g) removing said photoresist layer; and
   (h) dry etching said first, second and third dielectric layers using said intermediate mask layer as a mask, said dry etching consuming said intermediate mask layer.

8. The method of claim 7, further comprising a step of:
   (i) forming another metal layer on said third dielectric layer after said intermediate mask layer is consumed.

9. The method of claim 7, wherein said intermediate mask layer comprises titanium nitride.

10. The method of claim 7, wherein said intermediate mask layer comprises tantalum nitride.

11. The method of claim 7, wherein said second dielectric layer comprises siloxane SOG.

* * * * *